US012224185B2

(12) United States Patent
Itatani et al.

(10) Patent No.: US 12,224,185 B2
(45) Date of Patent: *Feb. 11, 2025

(54) METHOD OF MANUFACTURING SEMICONDUCTOR DEVICE

(71) Applicant: Kokusai Electric Corporation, Tokyo (JP)

(72) Inventors: Hideharu Itatani, Toyama (JP); Toshiyuki Kikuchi, Toyama (JP); Naofumi Ohashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/354,190

(22) Filed: Jul. 18, 2023

(65) Prior Publication Data

US 2023/0360930 A1 Nov. 9, 2023

Related U.S. Application Data

(63) Continuation of application No. 17/722,726, filed on Apr. 18, 2022, now Pat. No. 11,728,183, which is a (Continued)

(30) Foreign Application Priority Data

Jul. 9, 2021 (JP) ................................. 2021-113917

(51) Int. Cl.
*H01L 21/67* (2006.01)
*C23C 16/44* (2006.01)
*C23C 16/455* (2006.01)

(52) U.S. Cl.
CPC .... *H01L 21/67017* (2013.01); *C23C 16/4412* (2013.01); *C23C 16/45519* (2013.01); *C23C 16/45557* (2013.01)

(58) Field of Classification Search
CPC ........... H01L 21/67017; C23C 16/4412; C23C 16/45519; C23C 16/45557
See application file for complete search history.

(56) References Cited

U.S. PATENT DOCUMENTS 11,322,370 B1 * 5/2022 Itatani ................. C23C 16/4412
11,728,183 B2 * 8/2023 Itatani ............... C23C 16/45519
700/106

(Continued)

FOREIGN PATENT DOCUMENTS

JP 2017-045880 A 3/2017

OTHER PUBLICATIONS

Taiwan Office Action, Taiwan Patent Application No. 110134342, Jun. 7, 2022.

*Primary Examiner* — Kyoung Lee
(74) *Attorney, Agent, or Firm* — Volpe Koenig

(57) ABSTRACT

There is provided a technique that includes adjusting a pressure of each of a plurality of process chambers, by adjusting an opening degree of a pressure-adjusting valve included in a common gas exhaust pipe, which is connected to a plurality of process chamber exhaust pipes and is disposed to merge respective process chamber exhaust pipes on a downstream side of the plurality of process chamber exhaust pipes, to a predetermined opening degree and by exhausting an atmosphere of each of the process chambers from the plurality of process chamber exhaust pipes and the common gas exhaust pipe while supplying an inert gas to the plurality of process chambers; processing a substrate in each of the process chambers; and detecting a fluctuation of pressures in the process chamber exhaust pipes by measuring, by one or more pressure detectors, the pressures of the process chamber exhaust pipes.

20 Claims, 8 Drawing Sheets

Related U.S. Application Data continuation of application No. 17/477,174, filed on Sep. 16, 2021, now Pat. No. 11,322,370.

(56) References Cited

U.S. PATENT DOCUMENTS

| | | |
|---|---|---|
| 2013/0022743 A1 | 1/2013 | Moriyama et al. |
| 2017/0062254 A1 | 3/2017 | Hirochi |
| 2017/0253968 A1 | 9/2017 | Yahata |

\* cited by examiner

| Operation | Pressure detector (227a) | Pressure detector (227b) | Difference between pressure detector (227a) and pressure detector (227b) |
|---|---|---|---|
| Maintenance | a | a | α |
| Control pressure controller | a | a | β |
| Notification | b | b | γ |
| Stop | c | c | δ |

FIG. 6

| | | Gas supply into chamber (100a) | | | Gas supply into chamber (100b) | | | Operation of parts | | | | |
|---|---|---|---|---|---|---|---|---|---|---|---|---|
| | Step | First process gas | Second process gas | Inert gas | First process gas | Second process gas | Inert gas | Pressure detector (227a) | Pressure detector (227b) | Timer (380e) | APC (222) | Exhaust pump (223) |
| S102 | Substrate-processing-position-moving step | — | — | ○ | — | — | ○ | — | — | — | — | ● |
| S104 | First pressure-adjusting step | — | — | ○ | — | — | ○ | ● | ● | — | Opening degree adjusted | ● |
| S106 | Film-processing step | ○ | ○ | ○ | ○ | ○ | ○ | — | — | — | Opening degree fixed | ● |
| S108 | Pressure-rising-speed-calculating step | — | ○ | ○ | — | — | ○ | ● | ● | ● | Opening degree fixed | ● |
| S112 | Second pressure-adjusting step | — | — | ○ | — | — | ○ | ● | ● | — | Opening degree fixed | ● |
| S114 | Substrate-transfer-position-moving step | — | — | ○ | — | — | ○ | — | — | — | Opening degree fixed | ● |
| S120 | Substrate-processing-position-moving step | — | — | ○ | — | — | ○ | — | — | — | Opening degree fixed | ● |
| S122 | Third pressure-adjusting step | — | — | ○ | — | — | ○ | ● | ● | — | Opening degree fixed | ● |

○ Supply gas to process chamber
● Operate parts
— Do not supply gas to process chamber, do not operate parts

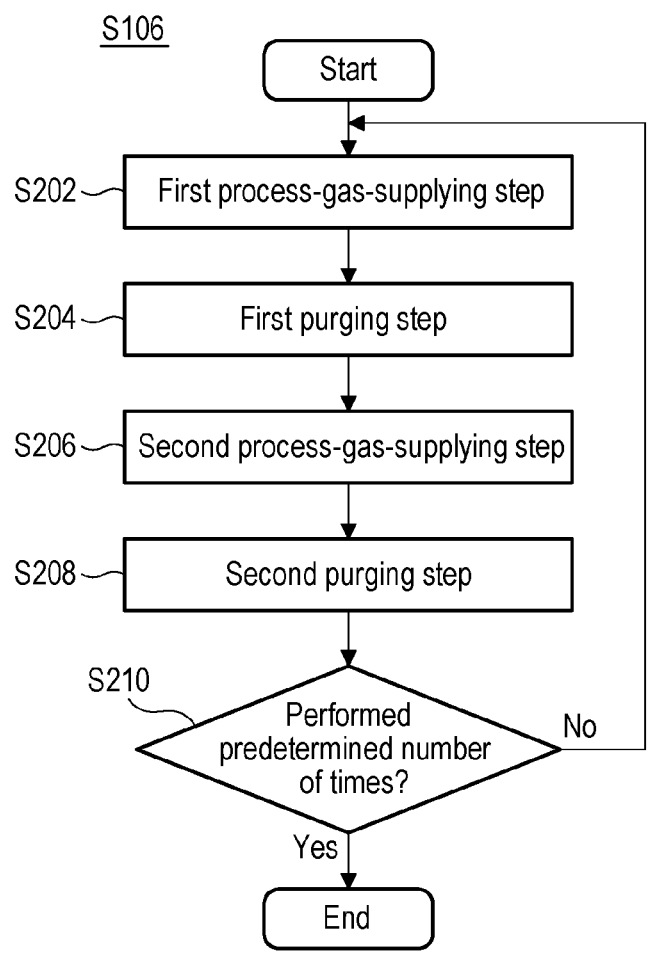

METHOD OF MANUFACTURING SEMICONDUCTOR DEVICE

CROSS-REFERENCE TO RELATED APPLICATIONS

This application is a continuation application of U.S. patent application Ser. No. 17/722,726, filed Apr. 18, 2022, which is a continuation application of U.S. patent application Ser. No. 17/477,174, filed Sep. 16, 2021, issued as U.S. Pat. No. 11,322,370, issued on May 3, 2022, which is based upon and claims the benefit of priority from Japanese Patent Application No. 2021-113917, filed on Jul. 9, 2021, the entire contents of which are incorporated herein by reference.

TECHNICAL FIELD

The present disclosure relates to a method of manufacturing a semiconductor device.

BACKGROUND

In the related art, as a substrate processing apparatus used in a process of manufacturing a semiconductor device, for example, there is a substrate processing apparatus including a plurality of process chambers for processing a substrate and having a common exhaust system for the plurality of process chambers. Specifically, there is a substrate processing apparatus in which exhaust pipes are connected to a plurality of process chambers, respectively, and the exhaust pipes merge on the downstream side thereof. It may be possible to improve productivity by performing the same process to the substrate in each process chamber.

SUMMARY

The exhaust pipes are connected to the process chambers, but if their exhaust performance is lower than the desired performance, the quality of substrate processing may also deteriorate, which results in decrease in a yield.

Some embodiments of the present disclosure provide a technique capable of predicting a reduction in exhaust performance and maintaining high productivity.

According to one or more embodiments of the present disclosure, there is provided a technique that includes adjusting a pressure of each of a plurality of process chambers, by adjusting an opening degree of a pressure-adjusting valve included in a common gas exhaust pipe, which is connected to a plurality of process chamber exhaust pipes individually connected to the plurality of process chambers, respectively, and is disposed to merge respective process chamber exhaust pipes on a downstream side of the plurality of process chamber exhaust pipes, to a predetermined opening degree and by exhausting an atmosphere of each of the process chambers from the plurality of process chamber exhaust pipes and the common gas exhaust pipe while supplying an inert gas to the plurality of process chambers; processing a substrate in each of the process chambers, by supplying a process gas to the plurality of process chambers and by exhausting the atmosphere of each of the process chambers from the plurality of process chamber exhaust pipes and the common gas exhaust pipe; and detecting a fluctuation of pressures in the process chamber exhaust pipes by measuring, by one or more pressure detectors, the pressures of the process chamber exhaust pipes for a predetermined time in parallel with supplying the inert gas to the plurality of process chambers.

BRIEF DESCRIPTION OF DRAWINGS

The accompanying drawings, which are incorporated in and constitute a part of the specification, illustrate embodiments of the present disclosure.

FIG. 4 is an explanatory diagram for explaining a table included in the controller according to the first embodiments.

FIG. 6 is an explanatory diagram for explaining the relationship between each step of the flow according to the first embodiments and the operation of parts.

FIG. 7 is a flow chart of a film-processing step according to the first embodiments.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be now described in detail with reference to the drawings.

First Embodiments

Figure 1:
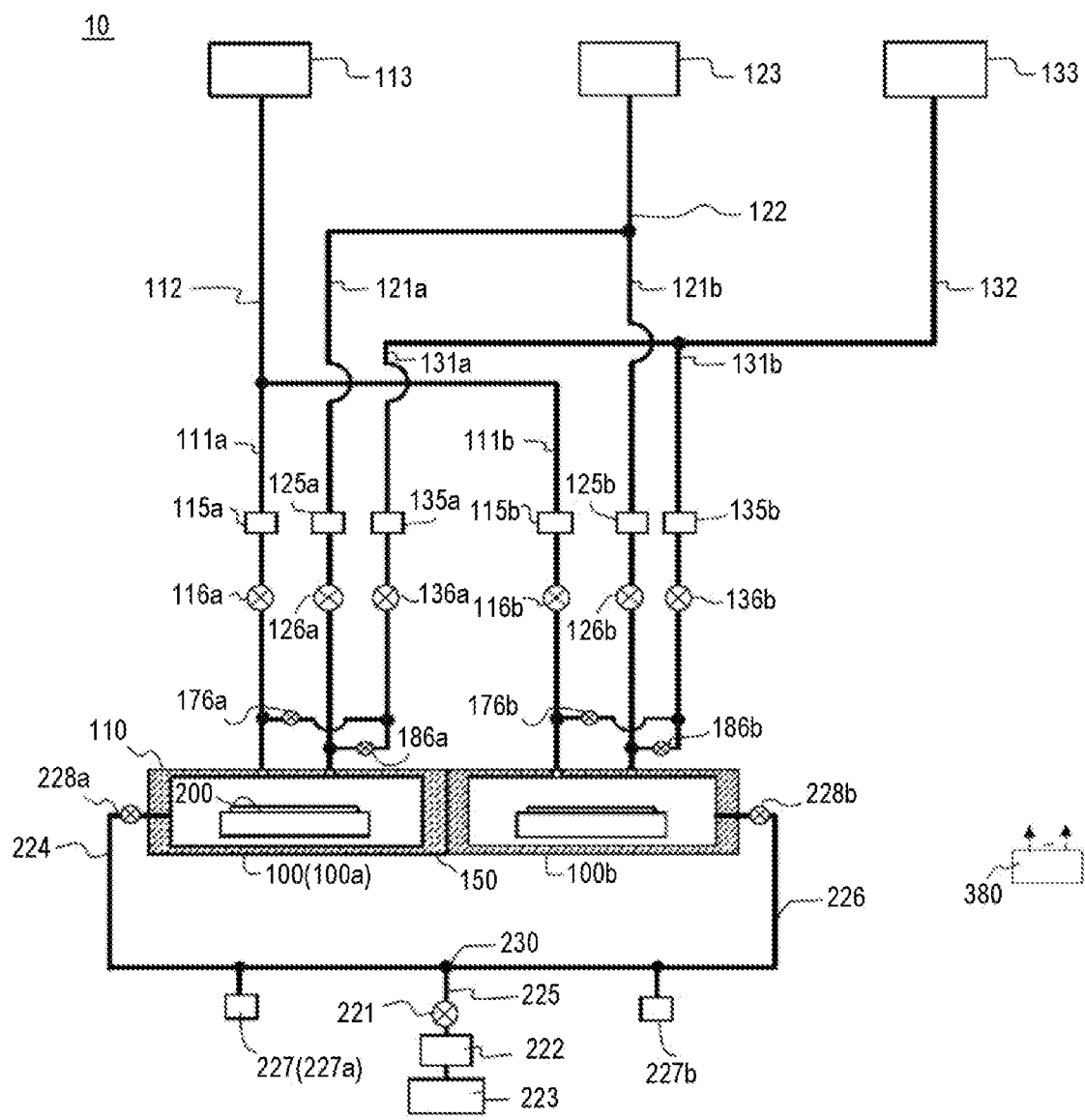
FIG. 1 is a schematic configuration diagram of a substrate processing apparatus according to a first embodiments.

First, the first embodiments of the present disclosure will be described with reference to the drawings.
(1) Configuration of Substrate Processing Apparatus FIG. 1 is a schematic configuration diagram of a substrate processing apparatus according to the first embodiments. As shown in FIG. 1, the substrate processing apparatus 10 is roughly classified into a process module 110, and a gas supply part (gas supplier) and a gas exhaust part connected to the process module 110.
(Process Module)

The process module 110 includes a chamber 100 for performing a predetermined process to the substrate 200. The chamber 100 includes a chamber 100a and a chamber 100b. That is, the process module 110 includes a plurality of chambers 100a and 100b. A partition wall 150 is installed between the chambers 100a and 100b such that the atmospheres in the chambers 100a and 100b are not mixed. The detailed structure of the chamber 100 will be described later.

The substrate 200 to be processed includes, for example, a semiconductor wafer substrate in which a semiconductor integrated circuit device (semiconductor device) is embedded (hereinafter, also simply referred to as a "substrate" or a "wafer").
(Gas Supply Part)

The gas supply part (gas supplier) that supplies a process gas or the like to each of the chambers 100a and 100b is connected to the process module 110. The gas supply part includes a first gas supply part, a second gas supply part, and a third gas supply part. Hereinafter, the configuration of each gas supply part will be described.
(First Gas Supply Part)

First process gas supply pipes 111a and 111b are connected to the chambers 100a and 100b, respectively, and a first process gas common supply pipe 112 is connected to the first process gas supply pipes 111a and 111b. A first process gas source 113 is disposed on the upstream side of the first process gas common supply pipe 112. Mass flow controllers (MFCs) 115a and 115b and process chamber side valves 116a and 116b are installed between the first process gas source 113 and the chambers 100a and 100b, respectively, sequentially from the upstream side. The first gas supply part includes the first process gas common supply pipe 112, the MFCs 115a and 115b, the process chamber side valves 116a and 116b, and the first process gas supply pipes 111a and 111b as first gas supply pipes. The first process gas source 113 may be included in the first gas supply part.

A precursor gas as a first process gas, which is one of the process gases, is supplied from the first process gas source 113. Here, a first element is, for example, silicon (Si). That is, the precursor gas is, for example, a silicon-containing gas. Specifically, a hexachlorodisilane ($Si_2Cl_6$, abbreviation: HCDS) gas may be used as the silicon-containing gas.
(Second Gas Supply Part)

Second process gas supply pipes 121a and 121b are connected to the chambers 100a and 100b, respectively, and a second process gas common supply pipe 122 is connected to the second process gas supply pipes 121a and 121b. A second process gas source 123 is disposed on the upstream side of the second process gas common supply pipe 122. Mass flow controllers (MFCs) 125a and 125b and process chamber side valves 126a and 126b are installed between the second process gas source 123 and the chambers 100a and 100b, respectively, sequentially from the upstream side. The second gas supply part (reaction gas supply part) includes the MFCs 125a and 125b, the process chamber side valves 126a and 126b, the second process gas common supply pipe 122, and the second process gas supply pipes 121a and 121b as second gas supply pipes. The second process gas source 123 may be included in the second gas supply part.

A reaction gas as a second process gas, which is one of the process gases, is supplied from the second process gas source 123. The reaction gas is, for example, an oxygen-containing gas. Specifically, for example, an oxygen ($O_2$) gas is used as the oxygen-containing gas. Here, the first gas supply part and the second gas supply part are collectively referred to as a process gas supply part.
(Third Gas Supply Part)

First inert gas supply pipes 131a and 131b are connected to the first process gas supply pipes 111a and 111b and the second process gas supply pipes 121a and 121b. Further, a first inert gas common supply pipe 132 is connected to the first inert gas supply pipes 131a and 131b. A first inert gas (purge gas) source 133 is disposed on the upstream side of the first inert gas common supply pipe 132. MFCs 135a and 135b, process chamber side valves 136a and 136b, and valves 176a, 176b, 186a, and 186b are installed between the first inert gas source 133 and the chambers 100a, 100b, respectively, sequentially from the upstream side. The third gas supply part (inert gas supply part) includes the MFCs 135a and 135b, the process chamber side valves 136a and 136b, the valves 176a, 176b, 186a, and 186b, the first inert gas common supply pipe 132, and the first inert gas supply pipes 131a and 131b. The first inert gas source 133 may be included in the third gas supply part. Further, the same configuration may be increased or decreased depending on the number of process modules installed in the substrate processing apparatus 10.

An inert gas (purge gas) is supplied from the first inert gas source 133. For example, a nitrogen ($N_2$) gas is used as the inert gas.
(Gas Exhaust Part)

The gas exhaust part that exhausts an internal atmosphere of the chamber 100a and an internal atmosphere of the chamber 100b is connected to the process module 110. Specifically, a process chamber exhaust pipe 224 is connected to the chamber 100a, and a process chamber exhaust pipe 226 is connected to the chamber 100b. That is, a plurality of process chamber exhaust pipes 224 and 226 are individually connected to a plurality of chambers 100a respectively.

A common gas exhaust pipe 225 is connected to the process chamber exhaust pipes 224 and 226. That is, the common gas exhaust pipe 225 is disposed on the downstream side of the process chamber exhaust pipes 224 and 226 so as to merge the process chamber exhaust pipes 224 and 226. As a result, the process chamber exhaust pipe 224 and the process chamber exhaust pipe 226 are merged at a merging portion 230 at the downstream end and further connected to the common gas exhaust pipe 225.

An exhaust pump 223 is disposed on the downstream side of the common gas exhaust pipe 225. An auto pressure controller (APC; also called a pressure-adjusting valve) 222, a valve 221, and valves 228a and 228b are installed between the exhaust pump 223 and the chambers 100a and 100b, respectively, sequentially from the downstream side. The gas exhaust part includes the APC 222, the valve 221, the valves 228a and 228b, the process chamber exhaust pipes 224 and 226, and the common gas exhaust pipe 225. In this way, the internal atmosphere of the chamber 100a and the internal atmosphere of the chamber 100b are exhausted by one exhaust pump 223.

The process chamber exhaust pipe 224 is installed with a pressure detector 227a. The pressure detector 227a detects an internal pressure of the process chamber exhaust pipe 224 and can be configured by using, for example, a pressure sensor.

Further, the process chamber exhaust pipe 226 is installed with a pressure detector 227b. The pressure detector 227b detects an internal pressure of the process chamber exhaust pipe 226 and can be configured by using, for example, a pressure sensor. A second inert gas supply pipe 141b is connected to the upstream side of the pressure detector 227b in the process chamber exhaust pipe 226. Any one of the pressure detectors 227a and 227b, or a combination thereof, may be referred to as an exhaust pipe pressure detector.
(Chamber)

Subsequently, the detailed structure of the chambers 100a and 100b in the process module 110 will be described. Here, since each of the plurality of chambers 100a and 100b has the same configuration, one chamber 100a (hereinafter, simply referred to as a chamber 100) will be described as an example.

Figure 2:
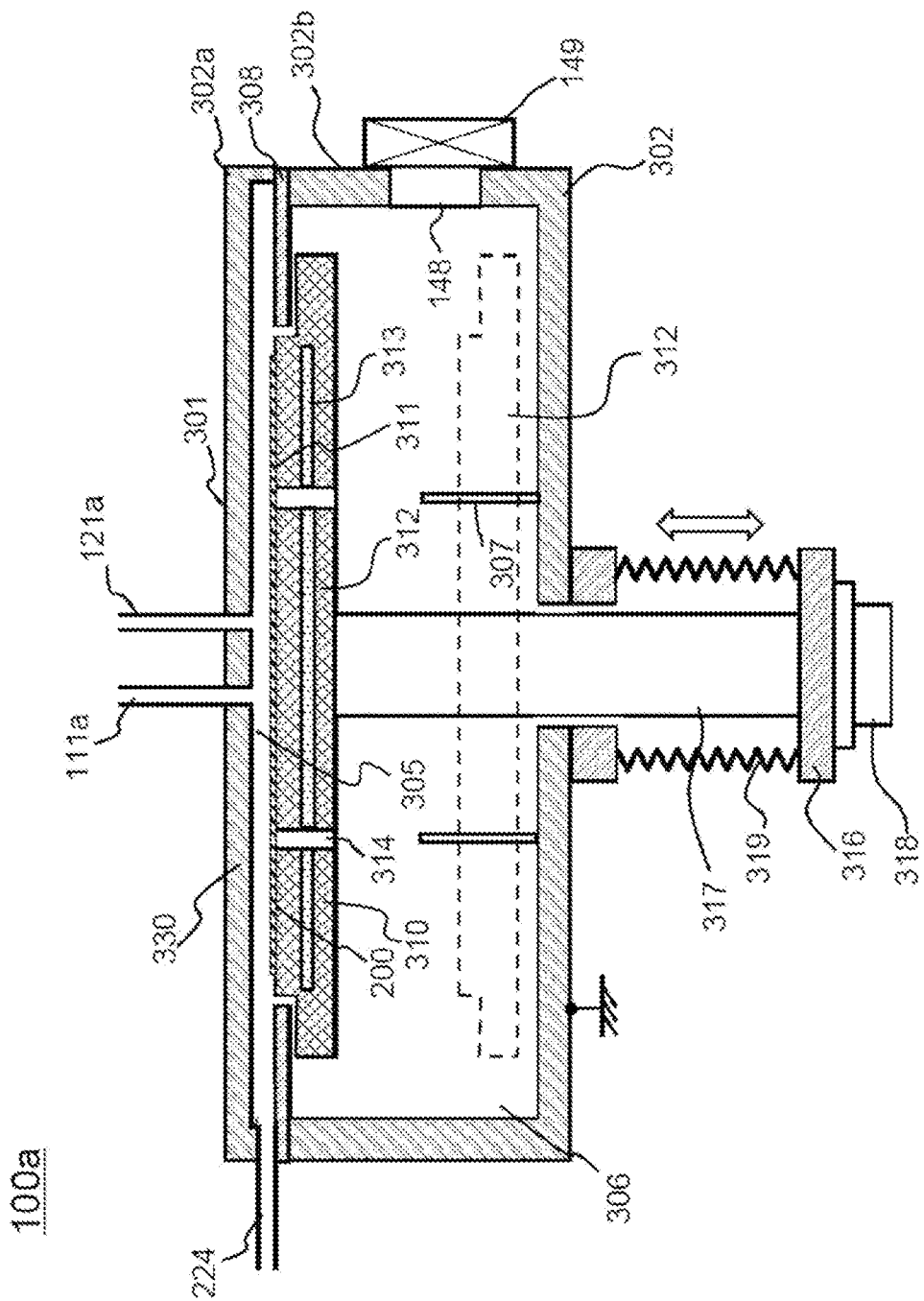
FIG. 2 is a configuration diagram of a chamber of the substrate processing apparatus according to the first embodiments.

FIG. 2 is a configuration diagram of a chamber of the substrate processing apparatus according to the first embodiments. The chamber 100 is made of, for example, a metal material such as aluminum (Al) or stainless steel (SUS) and is configured as a flat and airtight process container (airtight container) 302 having a circular cross section. The airtight container 302 includes an upper container 302a and a lower container 302b, and a partition plate 308 is installed between the upper container 302a and the lower container 302b. A substrate-loading/unloading port 148 adjacent to a gate valve 149 is installed on the side surface of the lower container 302b, and the substrate 200 moves between the interior of the lower container 302b and a vacuum transfer chamber (not shown) via the substrate-loading/unloading port 148. A plurality of lift pins 307 are installed at the bottom of the lower container 302b.

A substrate support 310 for supporting the substrate 200 is installed in the chamber 100 configured as the airtight container 302. The substrate support 310 mainly includes a substrate-mounting surface 311 on which the substrate 200 is mounted, a substrate-mounting table 312 including the substrate-mounting surface 311 on the surface of the substrate-mounting table 312, and a heater 313 as a heating source included in the substrate-mounting table 312. The substrate-mounting table 312 is installed with through-holes 314 through which the lift pins 307 penetrate at positions corresponding to the lift pins 307, respectively.

The substrate-mounting table 312 is supported by a shaft 317. A support of the shaft 317 penetrates a hole installed in the bottom wall of the chamber 100 and is further connected to an elevating mechanism 318 outside the chamber 100 via a support plate 316. By operating the elevating mechanism 318 to raise and lower the shaft 317 and the substrate-mounting table 312, it is possible to raise and lower the substrate 200 mounted on the substrate-mounting surface 311. Further, the circumference of the lower end of the shaft 317 is covered with a bellows 319, whereby the interior of the chamber 100 is kept airtight.

When the elevating mechanism 318 raises the substrate-mounting table 312, the substrate-mounting table 312 is located at a substrate-processing position shown in FIG. 2. In the substrate-processing position, the lift pins 307 are buried from the upper surface of the substrate-mounting surface 311 so that the substrate-mounting surface 311 supports the substrate 200 from below. When processing the substrate 200, the substrate-mounting table 312 is maintained at the substrate-processing position. Further, when the elevating mechanism 318 lowers the substrate-mounting table 312, the substrate-mounting table 312 is located at a substrate transfer position (see a broken line in FIG. 1) at which the substrate-mounting surface 311 faces the substrate-loading/unloading port 148. In the substrate transfer position, the upper ends of the lift pins 307 protrude from the upper surface of the substrate-mounting surface 311 so that the lift pins 307 support the substrate 200 from below.

A process space 305 for processing the substrate 200 and a transfer space 306 through which the substrate 200 passes when the substrate 200 is transferred to the process space 305 are formed in the chamber 100.

The process space 305 is a space formed between the substrate-mounting table 312 at the substrate-processing position and a ceiling 330 of the chamber 100. The structure constituting the process space 305 is also referred to as a process chamber 301. That is, the process space 305 is installed in the process chamber 301.

The transfer space 306 is a space mainly formed of the lower container 302b and the lower structure of the substrate-mounting table 312 at the substrate-processing position. The structure constituting the transfer space 306 is also referred to as a transfer chamber. The transfer chamber is disposed below the process chamber 301. It goes without saying that the transfer chamber is not limited to the above structure, but may be any structure as long as it constitutes the transfer space 306.

The first process gas supply pipes 111 of the first gas supply part and the second process gas supply pipes 121 of the second gas supply part are connected to the ceiling 330 facing the process space 305. More specifically, the first process gas supply pipe 111a and the second process gas supply pipe 121a are connected to the ceiling 330 in the chamber 100a, and the first process gas supply pipe 111b and the second process gas supply pipe 121b are connected to the ceiling 330 in the chamber 100b. As a result, the first process gas, the second process gas, or the inert gas is supplied into the process space 305.

The process chamber exhaust pipes 224 and 226 of the gas exhaust part are connected to a sidewall portion of the airtight container 302 facing the process space 305. More specifically, the process chamber exhaust pipe 224 is connected to the sidewall portion of the airtight container 302 in the chamber 100a, and the process chamber exhaust pipe 226 is connected to the sidewall portion of the airtight container 302 in the chamber 100b. As a result, a gas supplied into the process space 305 is exhausted through the process chamber exhaust pipes 224 and 226.

(Controller)

The substrate processing apparatus 10 has a controller 380 as a control part (control means) that controls the operations of various parts of the substrate processing apparatus 10.

Figure 3:
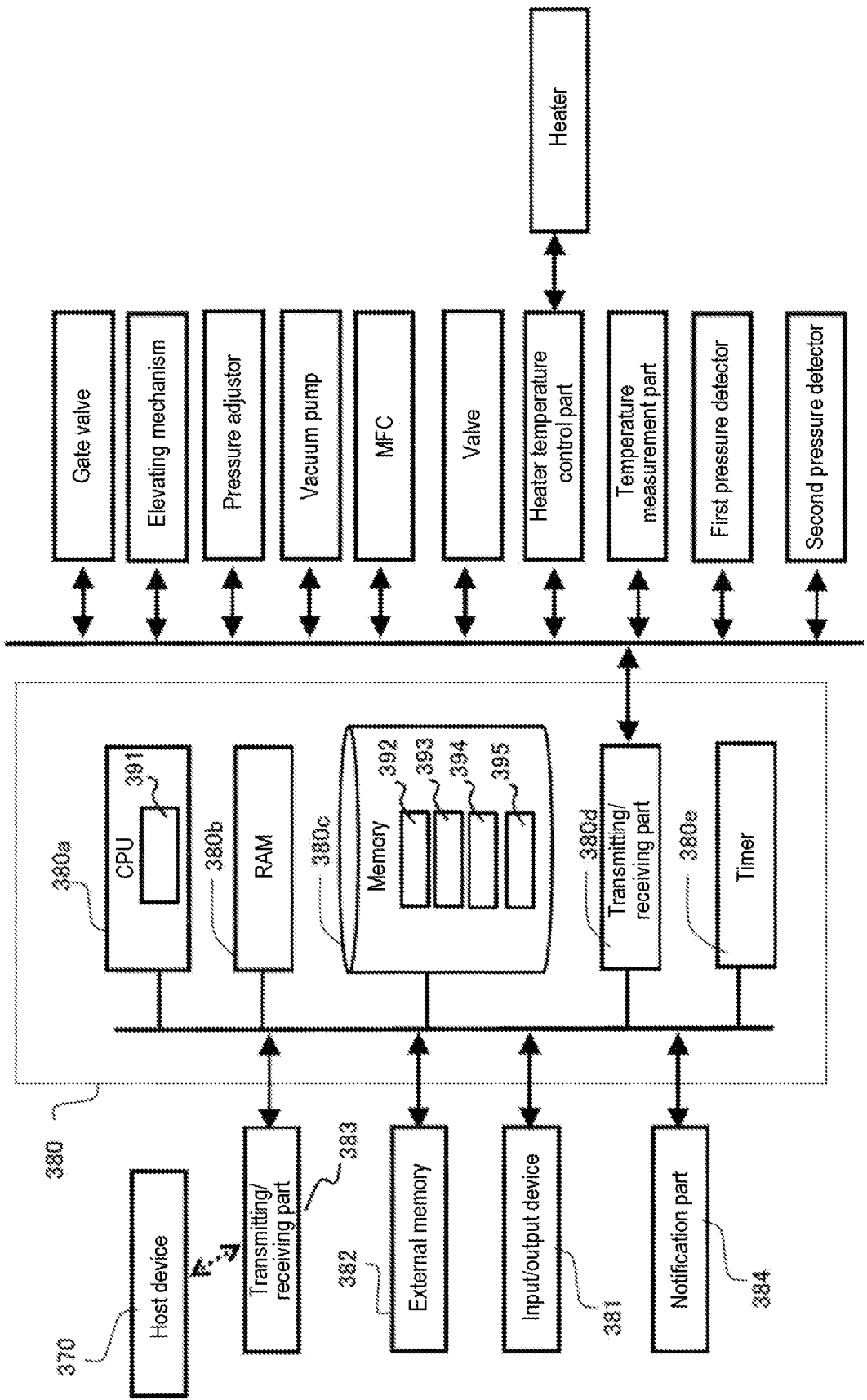
FIG. 3 is a configuration diagram of a controller of the substrate processing apparatus according to the first embodiments.

FIG. 3 is a configuration diagram of the controller of the substrate processing apparatus according to the first embodiments. The controller 380 is configured as a computer including at least an arithmetic part (CPU) 380a, a temporary memory (RAM) 380b, a memory 380c, a transmitting/receiving part 380d, and a timer 380e. The controller 380 is connected to each configuration of the substrate processing apparatus 10 via the transmitting/receiving part 380d, calls a program or a recipe from the memory 380c according to an instruction from a user who operates a host device 370 or an input/output device 381 connected via the transmitting/receiving part 383, and controls the operation of each configuration according to the contents the program or the recipe. A notification part 384 includes, for example, a display, a microphone, and the like and notifies notification information based on the contents of a control information memory 395.

The arithmetic part 380a has a calculation part 391 that calculates at least a pressure-rising speed value (pressure gradient value). The calculation part 391 obtains the pressure-rising speed value of pressure fluctuation based on a pressure fluctuation value detected by the pressure detector 227 during a period of time T1.

The memory 380c includes a pressure-recording part 392, a comparison data memory 393, a table 394, and the control information memory 395. The timer 380e counts the time taken for the pressure detector 227 to detect pressures of the exhaust pipes 224 and 226 in a pressure-rising-speed-value-calculating step S110 to be described later.

The pressure-recording part 392 records a pressure value detected by each of the pressure detectors 227a and 227b. The pressure value is recorded, for example, every time one substrate is processed. The calculation part 391 calculates a pressure-rising speed value based on the detected pressure value and the detected time.

The comparison data memory 393 stores comparison data to be compared with the pressure-rising speed value calculated by the calculation part 391. The comparison data is a preset value, for example, a pressure-rising speed value when the substrate processing apparatus 10 operates normally. The comparison data may be data updated after processing the substrate 200. In this case, for example, the highest quality data is used as the comparison data. Here, the highest quality data is, for example, the data with the least pressure fluctuation.

As shown in FIG. 4, the table 394 shows operations based on information comparing the calculated pressure-rising speed value and the comparison data and a difference between pressure-rising speed values calculated by the pressure detectors, further details of which will be described later.

The controller 380 may be configured as a dedicated computer or a general-purpose computer. For example, the controller 380 according to the present embodiments can be configured by preparing an external memory (for example, a magnetic tape, a magnetic disk such as a flexible disk or a hard disk, an optical disc such as a CD or a DVD, a magneto-optical disc such as a MO, a semiconductor memory such as a USB memory (USB Flash Drive) or a memory card, etc.) 382 that stores the above-mentioned program and installing the program on the general-purpose computer by using the external memory 382.

Further, a means for supplying the program to the computer is not limited to the case of supplying the program via the external memory 382. For example, a communication means such as the Internet or a dedicated line may be used to supply the program to the computer, or the program may be supplied by receiving information from the host device 370 via the transmitting/receiving part 383 without going through the external memory 382. Further, the controller 380 may be instructed by using an input/output device 381 such as a keyboard or a touch panel.

Further, the memory 380c and the external memory 382 may be configured as a non-transitory computer-readable recording medium. Hereinafter, these are also collectively referred simply to as a recording medium. When the term "recording medium" is used in the present disclosure, it may indicate a case of including the memory 380c only, a case of including the external memory 382 only, or a case of including both the memory 380c and the external memory 382.

(2) Procedure of Substrate-Processing Process

Next, the procedure of the substrate-processing process performed by using the substrate processing apparatus 10 including the above-described configuration will be described. The substrate-processing process is performed as a process of manufacturing a semiconductor device and is for performing a predetermined process to the substrate 200 to be processed. In the following description, as the predetermined process, an example in which a HCDS gas is used as the first process gas and an $O_2$ gas is used as the second process gas to form a film on the surface of the substrate 200 will be described. Here, it is assumed that an alternate supplying process of alternately supplying different process gases is performed.

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

Figure 5:
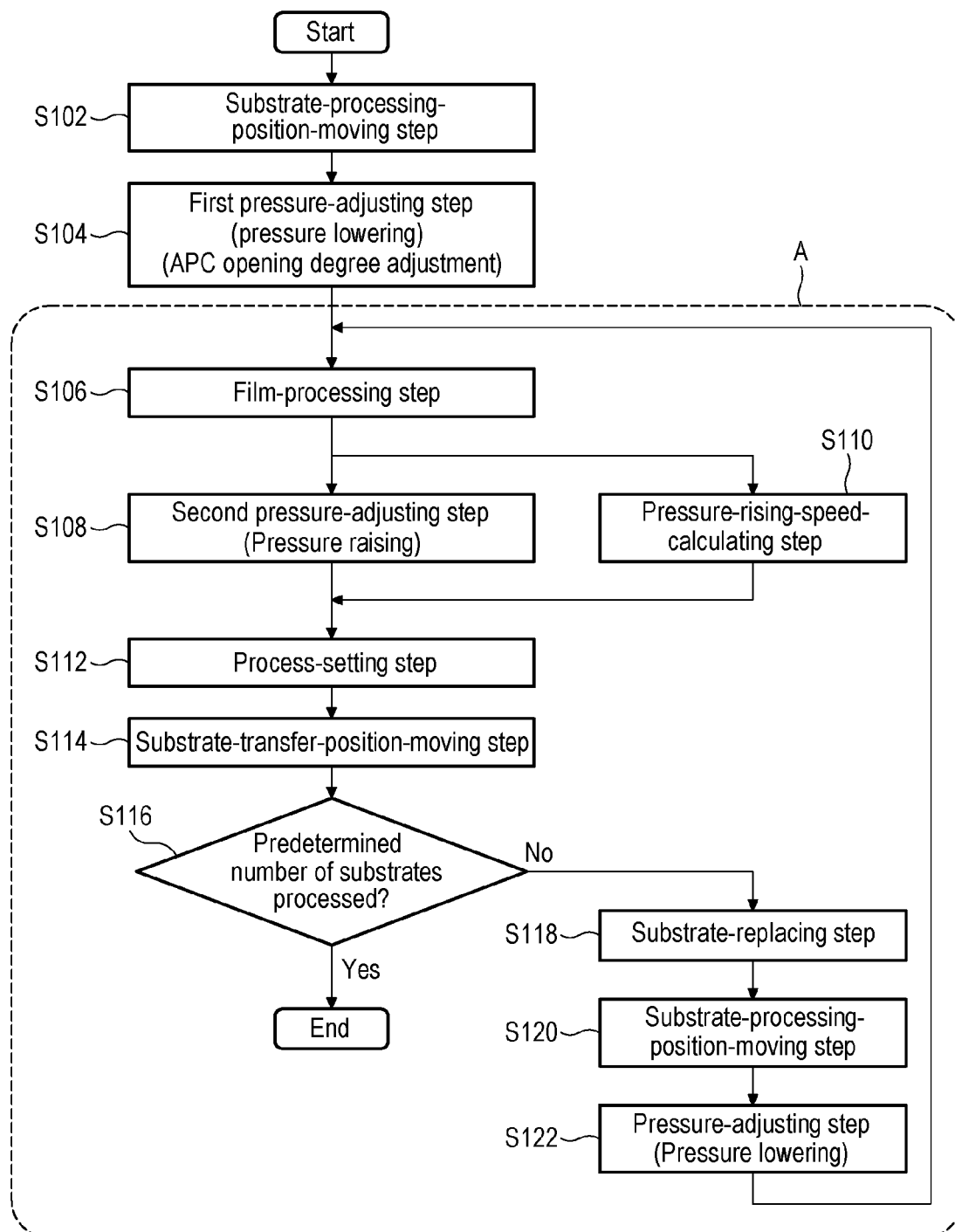
FIG. 5 is a flow chart of a substrate-processing process according to the first embodiments.

Hereinafter, the substrate-processing process will be described with reference to FIGS. 5 to 7. FIG. 5 illustrates the entire procedure of the substrate-processing process. FIG. 6 is a diagram for explaining an operating state of each part in each of the chambers 100a and 100b in the substrate-processing process shown in FIG. 5. FIG. 7 illustrates the details of a film-processing step S106 in the substrate-processing process.

In the following description, the operations of various parts constituting the substrate processing apparatus 10 are controlled by the controller 380.

In the substrate-processing process, first, a substrate-loading/mounting step is performed. This step is not shown in FIG. 5. In the substrate-loading/mounting step, the substrate-mounting table 312 in the chamber 100 is lowered to the substrate transfer position, and the lift pins 307 is passed through the through-holes 314 of the substrate-mounting table 312. As a result, the lift pins 307 are in a state of protruding from the surface of the substrate-mounting table 312 by a predetermined height. Then, in that state, the gate valve 149 is opened to communicate the transfer space 306 with the vacuum transfer chamber (not shown), and the substrate 200 is loaded from the vacuum transfer chamber into the transfer space 306 by using a substrate transfer device (not shown) and is transferred onto the lift pins 307. As a result, the substrate 200 is supported in a horizontal posture on the lift pins 307 protruding from the surface of the substrate-mounting table 312.

(Substrate-Processing-Position-Moving Step: S102)

A substrate-processing-position-moving step S102 will be described. After the substrate 200 is loaded into the chamber 100, the substrate transfer device is retracted to the outside of the chamber 100, and the gate valve 149 is closed to seal the interior of the chamber 100. After that, the substrate 200 is mounted on the substrate-mounting surface 311 by raising the substrate-mounting table 312, and the substrate-mounting table 312 is further raised to the substrate-processing position to locate the substrate 200 on the substrate-mounting surface 311 in the process space 305.

At this time, electric power is supplied to the heater 313 embedded inside the substrate-mounting table 312 to control the surface of the substrate 200 on the substrate-mounting surface 311 to have a predetermined temperature. The temperature of the substrate 200 is, for example, the room temperature or higher and 800 degrees C. or lower, specifically the room temperature or higher and 500 degrees C. or lower. At that time, the temperature of the heater 313 is adjusted by the controller 380 to extract a control value based on temperature information detected by a temperature sensor (not shown) and control a degree of supplying electric power to the heater 313.

In this step, as shown in FIG. 6, without supplying the first process gas and the second process gas from the chambers 100a and 100b, respectively, an inert gas is supplied from the third gas supply part. Furthermore, the exhaust pump 223 is operated. At this time, the operations of the APC 222, the pressure detectors 227a and 227b, and the timer 380e may be stopped.

While the substrate-mounting table 312 moves to the substrate-processing position, the process chamber 301 of each chamber 100 is set to have an inert gas atmosphere so that dust and the like generated when the substrate-mounting table 312 moves does not enter into the process chamber 301.

It is assumed that the operations in the substrate-loading/mounting step and the substrate-processing-position-moving step S102 are performed in the same manner in each of the chambers 100a and 100b.

(First Pressure-Adjusting Step: S104)

A first pressure-adjusting step S104 will be described. When the substrate 200 moves to the substrate-processing position, the internal pressure of the process chamber 301 is adjusted to a predetermined pressure. The predetermined pressure is, for example, a pressure in a first process-gas-supplying-step S202 of the film-processing step S106. Therefore, here, the pressure is lowered. Here, as shown in FIG. 6, for example, the third gas supply part is operated to supply the inert gas to the process chamber 301, and the exhaust pump 223 is operated to set the process chamber 301 to an inert gas atmosphere. At this time, the opening degree of the APC 222 is adjusted and fixed. Further, the pressure detectors 227a and 227b may also be operated, and the pressure of each process chamber 301 may be adjusted based on detection data.

(Film-Processing Step: S106)

Next, the film-processing step S106 will be described. In the film-processing step S106, gases are supplied from the first gas supply part and the second gas supply part, respectively, to perform a process to the substrate 200. Then, when the process is completed, the substrate 200 is unloaded from the chamber 100. This operation is performed repeatedly for a predetermined number of substrates 200. Details of this film-processing step S106 will be described later. When the film-processing step S106 is completed, the supply of the process gases from the first gas supply part and the second gas supply part is stopped. The supply of the inert gas from the third gas supply part may be stopped or continued. In this step, the opening degree of the APC 222 is fixed for the reason to be described later.

(Details of Film-Processing Step S106)

Subsequently, the details of the film-processing step S106 will be described with reference to FIG. 7.

(First Process-Gas-Supplying Step: S202)

The first process-gas-supplying step S202 will be described. When the substrate 200 in the process space 305 reaches a predetermined temperature, first, the first process-gas-supplying step S202 is performed. In the first process-gas-supplying step S202, the valves 116a and 116b are opened, and the MFCs 115a and 115b are adjusted so that a HCDS gas has a predetermined flow rate. The supply flow rate of the HCDS gas is set to, for example, 100 sccm or more and 800 sccm or less. At this time, a $N_2$ gas is supplied from the third gas supply part. The $N_2$ gas supplied from the third gas supply part is used as a carrier gas for the HCDS gas.

Further, in the first process-gas-supplying step S202, the valves 221, 228a, and 228b are opened, and the opening degree of the APC 222 is adjusted while operating the pump 223, so that the internal pressure of the chamber 100 becomes a desired pressure. Specifically, the pressure of each of the process space 305 and the transfer space 306 is controlled to be, for example, a predetermined value within the range of 50 to 300 Pa. The predetermined value is, for example, 250 Pa.

In the process space 305 to which the HCDS gas is supplied, the HCDS gas is decomposed into silicon components and the like by heat and is supplied onto the substrate 200. As a result, a silicon-containing layer as a "first element-containing layer" is formed on the surface of the substrate 200. The silicon-containing layer corresponds to a precursor of a thin film to be formed.

Then, after a predetermined time has elapsed from the start of this step, the valves 116a and 116b are closed to stop the supply of the HCDS gas.

(First Purging Step: S204)

A first purging step S204 will be described. After the completion of the first process-gas-supplying step S202, the first purging step S204 is then performed. In the first purging step S204, with the valves 136a, 136b, 176a, and 176b fixed at the open state, the valves 186a and 186b are further opened to supply a $N_2$ gas to the process space 305, and the exhaust by the pump 223 or the like is continued to purge the atmosphere.

Then, after a predetermined time has elapsed from the start of this step, the valves 136a and 136b are closed to stop the purging of the atmosphere by the supply of the $N_2$ gas.

(Second Process-Gas-Supplying Step: S206)

A second process-gas-supplying step S206 will be described. After closing the valves 136a and 136b to complete the first purging step S204, the second process-gas-supplying step S206 is then performed. In the second process-gas-supplying step S206, the valves 126a and 126b are opened, the flow rate of an $O_2$ gas is adjusted by the MFCs 125a and 125b, and the supply of the $O_2$ gas into the process space 305 is started. The supply flow rate of the $O_2$ gas is set to, for example, 100 sccm or more and 6,000 sccm or less. At this time, the valves 136a and 136b are opened to supply a $N_2$ gas from the third gas supply part. The $N_2$ gas supplied from the third gas supply part is used as a carrier gas or a dilution gas for the $O_2$ gas.

Further, in the second process-gas-supplying step S206, as in the case of the first process-gas-supplying step S202, the exhaust by the pump 223 or the like is continued so that the internal pressure of the chamber 100 becomes a desired pressure.

The $O_2$ gas supplied to the process space 305 is decomposed by heat. In the process space 305, the decomposed $O_2$ gas is supplied onto the substrate 200. As a result, the silicon-containing layer is modified by the $O_2$ gas so that a thin film composed of a layer containing a silicon element and an oxygen element is formed on the surface of the substrate 200.

Then, after a predetermined time has elapsed from the start of this step, the valves 126a and 126b are closed to stop the supply of the $O_2$ gas.

(Second Purging Step: S208)

A second purging step S208 will be described. After the completion of the second process-gas-supplying step S206, the second purging step S208 is then performed. In the second purging step S208, as in the first purging step S204, a $N_2$ gas is supplied from the first inert gas supply pipes 131a and 131b to purge the atmosphere of the process space 305.

Then, after a predetermined time has elapsed from the start of this step, the valves 136a and 136b are closed to stop the purging of the atmosphere by the supply of the $N_2$ gas.

(Determining Step: S210)

A determining step S210 will be described. When the second purging step S208 is completed, the controller 380 determines whether or not one cycle including the first process-gas-supplying step S202, the first purging step S204, the second process-gas-supplying step S206, and the second purging step S208, which are sequentially performed, has been performed a predetermined number of times (n cycles).

When the cycle has not been performed a predetermined number of times ("No" in S210), the cycle including the first process-gas-supplying step S202, the first purging step S204, the second process-gas-supplying step S206, and the second purging step S208 are repeated. When the cycle has been performed a predetermined number of times ("Yes" in S210), the series of steps shown in FIG. 7 is completed.

By the way, the opening degree of the APC 222 is fixed during the first process-gas-supplying step S202 to the second purging step S208, as shown in FIG. 6. Here, the reason for this will be explained.

In the present embodiments, the first process-gas-supplying step S202 to the second purging step S208 are continuously performed, but in consideration of a throughput, each step is performed in a very short period of time. For example, it takes less than 60 seconds, specifically about 50 seconds, from the first process-gas-supplying step S202 to the second purging step S208.

This is the time that can be realized because the volume of the process chamber 301 is small. For example, as a comparative example, there is a vertical apparatus having a large volume for the process chamber. When the first process-gas-supplying step S202 to the second purging step S208 are performed in the vertical apparatus, the time for filling the process chamber with a gas or the time for discharging a gas from the process chamber is longer than in the present embodiments due to the large volume. For example, it takes about 120 seconds.

Since the process chamber 301 of the present embodiments has a smaller volume than the vertical apparatus which is the comparative example, the amount of gas supplied into the process chamber 301 can be smaller than that of the vertical apparatus. Therefore, in the first process-gas-supplying step S202 and the second process-gas-supplying step S206, the gas can be filled more quickly than in the vertical apparatus, and further, in the first purging step S204 and the second purging step S208, the atmosphere of the process chamber 301 can be more quickly exhausted than in the vertical apparatus.

By the way, since the gas is replaced in each step as described above, the pressure of the process chamber 301 may be adjusted in each step. It is conceivable that the pressure is adjusted by using an APC, for example, as in the first pressure-adjusting step S104. However, it is technically difficult to adjust the opening degree of the APC in a short time. Therefore, if the pressure is adjusted for each step by using the APC, the throughput will be significantly reduced.

Under such circumstances, in the substrate processing apparatus 10 of the present embodiments, the opening degree of the APC 222 is fixed during the first process-gas-supplying step S202 to the second purging step S208. Further, even when a plurality of substrates are continuously processed, it is preferable to fix the opening degree of the APC 222 from the viewpoint of improving the throughput. That is, the opening degree of the APC 222 is fixed during A in FIG. 5.

Further, in the apparatus of the present embodiments, since the opening degree of the APC 222 is fixed as described above, the diameters of the exhaust pipes 224 and 226 are set to be very thin, for example, 20 to 30 mm. With such a configuration, since the pressures of the exhaust pipes 224 and 226 can be accurately detected, even when the opening degree of the APC 222 is fixed, the pressure can accurately adjusted by the cooperation of the gas supply part and the exhaust pump.

(Second Pressure-Adjusting Step: S108)

Next, a second pressure-adjusting step S108 will be described. After the film-processing step S106 is completed, the internal pressure of the process chamber 301 is adjusted. For example, the internal pressure of the process chamber 301 is raised from a vacuum level pressure.

Specifically, while the supply of process gases from the first gas supply part and the second gas supply part is stopped, an inert gas is supplied from the third gas supply part to each process chamber 301, and the exhaust flow rate of the inert gas is adjusted by the exhaust pump 223 to raise the internal pressure of the process chamber 301. The inert gas supplied from the third gas supply part is supplied to each process chamber 301 at the same flow rate.

(Pressure-Rising-Speed-Calculating Step: S110)

Next, a pressure-rising-speed-calculating step S110 will be described. The pressure-rising-speed-calculating step S110 is a step performed in parallel with the second pressure-adjusting step S108. In the pressure-rising-speed-calculating step S110, the pressure at the exhaust pipes 224 and 226 is detected. Here, after the lapse of time T1 after the pressure detection is started, the pressure detection is stopped and a pressure-rising speed value is calculated. For example, the pressure-rising speed value is calculated from a pressure value when the pressure detection is started and a pressure value detected after the time T1. The time T1 is counted by the timer 380e. In this step, the opening degree of the APC 222 is fixed for the reason to be described above.

The pressure detectors 227a and 227b start detecting the pressure after the inert gas passes through connection portions with the exhaust pipes 224 and 226. The measurement time is counted by the timer 380e, and the detection is stopped after the lapse of time T1.

The time T1 is a time during which the pressure-rising speed value can be detected, and is a time set before the pressure reaches a target pressure. Next, the reason for this will be explained.

As a method of detecting the pressure, it is conceivable to momentarily detect the pressure only once in a shorter time than T1 or detect the pressure after time T1. However, when the pressure is detected momentarily only once, the pressure cannot be detected accurately if an exhaust flow is unstable.

Further, as a case of detecting the pressure after time T1, it is considered, for example, that the pressures of the process chamber 100a and the process chamber 100b reach a target pressure. In this case, since the pressures have reached the target pressure in both the process chambers, the pressure in the exhaust pipe 224 becomes equal to the pressure in the exhaust pipe 226. Therefore, since the pressure-rising speed in the exhaust pipe 224 becomes equal to that in the exhaust pipe 226, it is unknown which of the pipes is clogged.

On the other hand, as in the present embodiments, when the pressure detection is completed before the pressure reaches the target pressure, it can be known which of the exhaust pipe 224 and the exhaust pipe 226 is clogged. For example, a pipe without being clogged has a larger pressure-rising speed value than that of a pipe being clogged.

Further, it is preferable that the pressure detectors 227a and 227b have the same detection start time and detection end time and detect the pressures in parallel. By doing so, the pressure-rising speed value can be detected in each of the exhaust pipes 224 and 226 under the same exhaust conditions. Therefore, an accurate comparison can be made in a process-setting step S112 to be described later.

Further, since this step is performed between the film-processing step S106 and a substrate-replacing step S118 to be described later, it is performed between the time when the supply of process gas to the process chamber is stopped and the time when the substrate is unloaded from the process chamber.

Further, since this step is performed between the film processing step S106 and a substrate-transfer-position-moving step S114 to be described later, it is performed between the time when the supply of process gas to the process chamber is stopped and the time when the substrate moves to the substrate transfer position.

Further, since this step is performed before the substrate-replacing step S118, it is performed before the substrate 200 is unloaded from the process chamber 301.

Further, since this step is performed before the substrate-replacing step S118, the pressure detector 227 stops the pressure detection before the process gas is supplied from the process gas supply part into the process chamber 301. At this time, the pressure detection of the pressure detectors 227a and 227b installed in the exhaust pipes 224 and 226 of the respective process chambers is stopped.

(Process-Setting Step: S112)

Subsequently, the process-setting step S112 will be described. When the second pressure-adjusting step S108 and the pressure-rising-speed-calculating step S110 are completed, the process proceeds to the process-setting step S112.

The pressure-rising speed value calculated in the pressure-rising-speed-calculating step S110 is recorded in the pressure-recording part 392. The pressure-rising speed value recorded in the pressure-recording part 392 is compared with the comparison data stored in the comparison data memory 393. In addition, the data detected by the pressure detectors are compared with each other. Based on this, the subsequent operation of the substrate processing apparatus 10 is set.

As the type of comparison, the pressure-rising speed value calculated for each pressure detector is compared with the comparison data, and differences between the pressure-rising speed values calculated by the pressure detectors are compared with each other.

Further, as illustrated in FIG. 4, in the comparison between the pressure-rising speed value calculated for each pressure detector and the comparison data, for example, an operation is set for each of three levels, level a, level b, and level c. For example, level a has a divergence of 0 to 5%, level b has a divergence of 6 to 10%, and level c has a divergence of 11% or more.

Here, when the pressure-rising speed value is level a, it is determined that there is no problem, and the setting is maintained to process the next substrate. When the pressure-rising speed value is level b, it is determined that clogging of the exhaust pipe may affect the substrate processing if the process is continued as it is, and the notification part 384 notifies to that effect. At this time, for example, a substrate to be processed next or a substrate in a lot to be processed next may not be loaded into the substrate processing apparatus 10. Further, here, a message prompting maintenance (for example, cleaning or replacement) of the exhaust pipe may be notified. Further, when the pressure-rising speed value is level c, it is determined that the substrate processing cannot be continued any more, and the process is stopped. By setting the subsequent process in this way, it is possible to prevent defective substrates from being output.

Further, the pressure-rising speed value of the exhaust pipe 224 calculated based on the data detected by the pressure detector 227a may be compared with the pressure-rising speed value of the exhaust pipe 226 calculated based on the data detected by the pressure detector 227b. In this case, the differences between the pressure-rising speed values are calculated. The differences are, for example, four levels, level α, level β, level γ, and level δ, and an operation is set for each level.

For example, level α has a divergence of 0 to 3%, level β has a divergence of 4 to 6%, level γ has a divergence of 7 to 10%, and level δ has a divergence of 11% or more. When the difference is level α, it is determined that there is no problem, and the process is continued to process the next substrate.

When the difference is level β and both the pressure detectors are at level α, it can be determined that the entire exhaust pipe does not meet a desired exhaust capacity, although there is no clogging. In that case, the APC 222 is readjusted before the next substrate 200 is loaded. The readjustment is performed, for example, in a third pressure-adjusting step S122.

When the difference is level γ, it is determined that clogging of the exhaust pipe may affect the substrate processing if the process is continued as it is, and the notification part 384 notifies to that effect. At this time, for example, a substrate to be processed next or a substrate in a lot to be processed next may not be loaded into the substrate processing apparatus 10. Further, here, a message prompting maintenance (for example, cleaning or replacement) of the exhaust pipe may be notified. Further, when the difference is level δ, it is determined that the substrate processing cannot be continued any more, and the process is stopped. By setting the subsequent process in this way, it is possible to prevent defective substrates from being output.

In the present embodiments, since it is possible to make determination before the next substrate 200 is loaded, the occurrence of defective substrates can be reduced.

(Substrate-Transfer-Position-Moving Step S114)

The substrate-transfer-position-moving step S114 will be described. In the substrate-transfer-position-moving step S114, the substrate-mounting table 312 in the chamber 100 is lowered to the substrate transfer position, and the substrate 200 is supported on the lift pins 307 protruding from the surface of the substrate-mounting table 312. As a result, the substrate 200 is transferred from the substrate-processing position to the substrate transfer position.

(Determining Step: S116)

Subsequently, a determining step S116 will be described. In the determining step S116, it is determined whether or not a predetermined number of substrates 200 have been processed. When it is determined that the predetermined number of substrates 200 have been processed, the process is completed via a substrate-unloading step (not shown). When it is determined that the predetermined number of substrates 200 have not been processed, the process proceeds to the substrate-replacing step S118.

(Substrate-Replacing Step: S118)

Subsequently, the substrate-replacing step S118 will be described. When it is determined in the determining step S116 that the predetermined number of substrates 200 have not been processed, the processed substrate 200 is replaced with an unprocessed substrate 200 to be processed. The unprocessed substrate 200 is made to stand by on the lift pins 207 as described above.

(Substrate-Processing-Position-Moving Step: S120)

Subsequently, a substrate-processing-position-moving step S120 will be described. The substrate 200 on standby on the lift pins 207 is moved to the substrate-processing position in the same manner as in the substrate-processing-position-moving step S102.

(Third Pressure-Adjusting Step: S122)

Subsequently, the third pressure-adjusting step S122 will be described. Here, with the opening degree of the APC 222 fixed, the internal pressure of the process chamber 301 is adjusted in the same manner as in the first pressure-adjusting step S104. After adjusting the pressure, the process proceeds to the film-processing step S106 where the film processing of the unprocessed substrate 200 is performed.

A dotted line region A shown in FIG. 5 indicates a region surrounding the steps in a state where the opening degree of the APC 222 is fixed. In this way, the opening degree of the APC 222 is fixed from the film-processing step S106 to the third pressure-adjusting step S122.

(Substrate-Unloading Step)

A substrate-unloading step will be described. This step is not shown in FIG. 5. When the substrate 200 is moved to the substrate transfer position, the gate valve 149 is opened and the substrate 200 is unloaded out of the chamber 100 by using the substrate transfer device (not shown).

Second Embodiments

Figure 8:
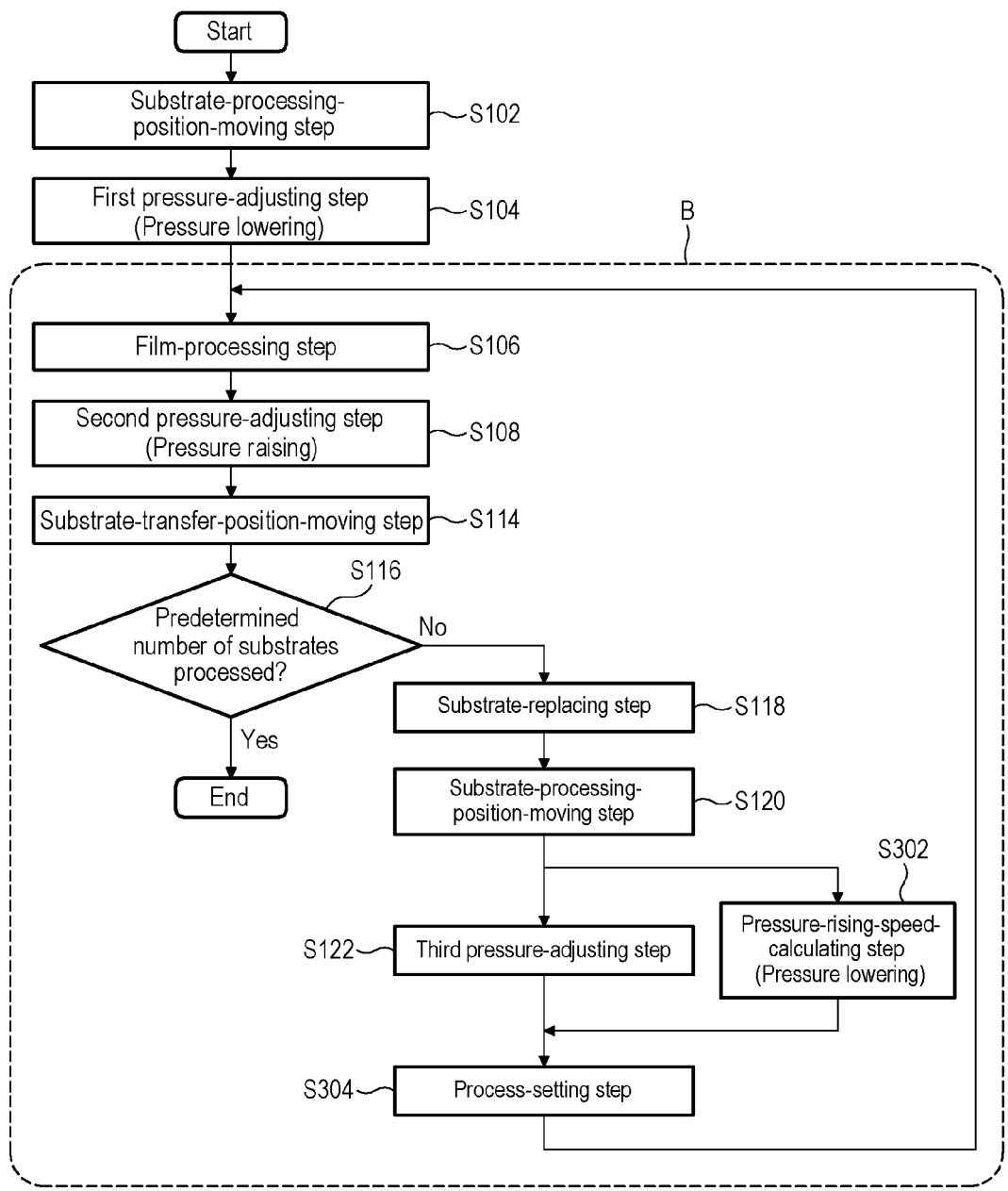
FIG. 8 is a flow chart of a substrate-processing process according to a second embodiments.

Next, the second embodiments of the present disclosure will be described with reference to FIG. 8. FIG. 8 is a flow chart of a substrate-processing process according to the second embodiments. A difference from the first embodiments is that a pressure-rising-speed-calculating step S302 is performed in parallel with the third pressure-adjusting step S122, and the process-setting step is performed before the film-processing step S106. Other points are the same as in the case of the first embodiments. Hereinafter, the difference will be mainly described.

In the second embodiments, the pressure-rising-speed-calculating step S302 is performed in parallel with the third pressure-adjusting step S122. Here, the pressure-rising speed values of the exhaust pipes 224 and 226 are calculated in the same manner as in the pressure-rising-speed-calculating step S110 of the first embodiments.

Specifically, this is as follows.

(Pressure-Rising-Speed-Calculating Step: S302)

The pressure-rising-speed-calculating step S302 will be described. In the pressure-rising-speed-calculating step S302, the pressure of each of the exhaust pipes 224 and 226 is detected for a predetermined time, and a pressure-rising speed value of the pressure is calculated. For the same reason as in the first embodiments, the opening degree of the APC 222 is fixed.

First, an inert gas is supplied from the third gas supply part into the process chamber 301 in a state where the supply of the process gas from the first gas supply part and the second gas supply part is stopped. At this time, the exhaust pump 223 is in operation following the first pressure-adjusting step S104. The supplied inert gas passes through each process chamber 301, the exhaust pipes 224 and 226, and the common gas exhaust pipe 225 to make the interior of each process chamber to an inert gas atmosphere.

The pressure detectors 227a and 227b start measurement when the inert gas begins to pass through the connection parts with the exhaust pipes 224 and 226. The measurement time is counted by the timer 380e, and the measurement is stopped after the lapse of a predetermined time. The detected pressure is recorded in the pressure-recording part 392. By detecting before proceeding to the film-processing step S106, the pressure can be detected in a more stable state.

The calculation part 391 calculates a pressure-rising speed value from a pressure value measured at the start of counting of the timer 380e, a pressure value measured after the lapse of time T2 from the start of counting, and the time T2. For example, the pressure-rising speed value is calculated based on the degree of pressure rise in a predetermined time.

Here, the reason for detecting the pressure during the limited time T2, instead of simply detecting the pressure, will be explained. As a method of detecting the pressure, it is conceivable to momentarily detect the pressure only once in a shorter time than T2 or detect the pressure after time T2. However, when the pressure is detected momentarily only once, the pressure cannot be detected accurately if an exhaust flow is unstable.

Further, as a case of detecting after time T2, it is considered, for example, that the atmosphere is completely exhausted in either the process chamber 100a or the process chamber 100b. In this case, since the exhausting atmosphere changes between the exhaust pipe 224 and the exhaust pipe 226, it is not possible to compare the pressures measured in the pipes.

On the other hand, as in the present embodiments, when the pressure detection is completed before the atmosphere is completely exhausted in any of the process chambers, since the exhaust pipe 224 and the exhaust pipe 226 have the same atmosphere, the comparison conditions can be the same. Therefore, an accurate comparison can be made in a process-setting step S304 to be described later.

Further, since this step is performed between the substrate-replacing step S118 and the film-processing step S106, it can be said that this step is performed between the time when the substrate 200 is loaded into the process chamber 301 and the time when a process gas is started to be supplied into the process chamber 301.

Further, since this step is performed before the film-processing step S106, the pressure detector 227 stops the pressure detection before the process gas is supplied from the process gas supply part into the process chamber 301. At this time, the pressure detection of the pressure detectors 227a and 227b installed in the exhaust pipes 224 and 226 of the respective process chambers is stopped.

(Process-Setting Step: S304)

Subsequently, the process-setting step S304 will be described. The calculated pressure-rising speed value is recorded in the pressure-recording part 392. The pressure-rising speed value recorded in the pressure-recording part 392 is compared with the comparison data stored in the comparison data memory 393. In addition, the data detected by the pressure detectors are compared with each other. The operation of the substrate processing apparatus 10 is selected based on the comparison result. Here, the determination is made in the same manner as in the first embodiments.

In the present embodiments, since the determination can be made in the state where the substrate 200 is loaded into the process chamber, the pressure of the exhaust pipe can be detected more accurately. Therefore, the state of clogging can be accurately grasped, and as a result, the number of defective substrates can be reduced.

Here, a vertical apparatus will be described as a comparative example. Since the vertical apparatus has a longer time of one cycle than the apparatus of the present embodiments and further processes a plurality of substrates at once, even if the processing time is long by using an APC, the productivity is not significantly reduced. Therefore, the APC is not fixed in the vertical apparatus.

Further, in the case of the vertical apparatus, since the volume of the process chamber is large, the diameter of the exhaust pipe is set to, for example, about 100 mm in order to quickly purge the atmosphere of the process chamber. Therefore, unlike the present embodiments, it is difficult to accurately detect the pressure of the exhaust pipe, which forces the pressure to be adjusted by using an APC.

Under such circumstances, it is difficult to realize the present embodiments with the configuration of the vertical apparatus.

OTHER EMBODIMENTS

Although the first embodiments and the second embodiments of the present disclosure have been described above, the present disclosure is not limited to the above-described embodiments, but various changes can be made without departing from the gist thereof.

In the above-described embodiments, the method of alternately supplying the precursor gas and the reaction gas to form a film has been described. However, the present disclosure can be applied to other methods only if the vapor phase reaction amount of the precursor gas and the reaction gas and the amount of by-products generated are within a permissible range. One example of such methods is to overlap the supply timings of the precursor gas and the reaction gas.

Further, in the above-described embodiments, the example of forming the silicon oxide film by using the silicon-containing gas as the precursor gas and the oxygen-containing gas as the reaction gas has been shown, but the present disclosure can also be applied to film formation where other gases are used. For example, there are an oxygen-containing film, a nitrogen-containing film, a carbon-containing film, a boron-containing film, a metal-containing film, a film containing two or more of these elements, and the like. Examples of these films may include a SiN film, an AlO film, a ZrO film, a HfO film, a HfAlO film, a ZrAlO film, a SiC film, a SiCN film, a SiBN film, a TiN film, a TiC film, a TiAlC film, and the like. By comparing the gas characteristics (adsorption, desorption, vapor pressure, etc.) of a precursor gas and a reaction gas used to form these films and appropriately changing the supply position and the structure of the process chamber, the same effects can be obtained.

Further, in the above-described embodiments, the $N_2$ gas has been described as an example of the inert gas, but the inert gas is not limited thereto but may be any gas as long as it cannot react with the process gas. For example, a rare gas such as a helium (He) gas, a neon (Ne) gas, or an argon (Ar) gas can be used as the inert gas.

Further, in the above-described embodiments, it has been described that the operation of each of the parts is stopped, but this does not necessarily mean that the operation of the entire parts is stopped. For example, the description that the operation of the gas supply is stopped means that a gas is not supplied to the process chamber 301.

Further, in the above-described embodiments, the expression "the same" or "practically the same" is used for the pressure difference, but it goes without saying that the pressure difference is not limited to exactly the same. For example, it naturally includes a state that is substantially equal to the extent that the quality of substrate processing can be maintained.

Further, in the above-described embodiments, the example in which two pressure detectors are used has been described, but without being limited thereto, one pressure detector may be used. In this case, it may be installed in the common gas exhaust pipe 225. By doing so, it is possible to determine the clogging state of the exhaust pipe even with a small number of parts. For example, it is determined whether or not the pressure reaches the target pressure within a predetermined time, and when the pressure does not reach the target pressure, it is determined that either one of the process chamber exhaust pipes or the common gas exhaust pipe 225 causes clogging.

According to the present disclosure in some embodiments, it is possible to predict a reduction in exhaust performance and maintain high productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) adjusting pressure of each of process chambers, by adjusting a pressure-adjuster provided to a gas exhauster comprising process chamber exhaust pipes individually connected to the process chambers, respectively, and a common gas exhaust pipe disposed to merge respective process chamber exhaust pipes on a downstream side of the process chamber exhaust pipes, and by exhausting an atmosphere of each of the process chambers from the gas exhauster while supplying inert gas to the process chambers; and
   (b) detecting a fluctuation in pressure of the process chamber exhaust pipes by measuring the pressure of the process chamber exhaust pipes for a predetermined time in parallel with supplying the inert gas to the process chambers.

2. The method of claim 1, wherein in (b), detecting the pressure of the process chamber exhaust pipes is started when the inert gas passes through the process chamber exhaust pipes.

3. The method of claim 1, wherein in (b), the pressure of the process chamber exhaust pipes is detected for the predetermined time between the time when a substrate is loaded into each of the process chambers and the time when supply of process gas to the process chambers is started.

4. The method of claim 1, wherein in (b), the pressure of the process chamber exhaust pipes is detected for the predetermined time between the time when supply of process gas to the process chambers is stopped and the time when a substrate is unloaded from each of the process chambers or between the time when supply of process gas into the process chambers is stopped and the time when a substrate moves to a substrate transfer position.

5. The method of claim 1, wherein the pressure-adjuster is a pressure-adjusting valve, and
   wherein in (b), the pressure of the process chamber exhaust pipes is detected in a state where an opening degree of the pressure-adjusting valve is fixed.

6. The method of claim 1, wherein the pressure-adjuster is a pressure-adjusting valve, and
   wherein the pressure-adjusting valve is installed in the common gas exhaust pipe.

7. The method of claim 1, wherein in (b), the pressure of the process chamber exhaust pipes is detected, respectively, in parallel.

8. The method of claim 1, wherein the pressure-adjuster is a pressure-adjusting valve, and
wherein in (b), one or more pressure detectors are operated in a state where an opening degree of the pressure-adjusting valve is fixed.

9. The method of claim 1, wherein in (b), detecting the pressure of the process chamber exhaust pipes is stopped before process gas is supplied to the process chambers from a process gas supplier or before a substrate is unloaded from each of the process chambers.

10. The method of claim 1, wherein in (b), detecting the pressure of the process chamber exhaust pipes is stopped before process gas is supplied to the process chambers from a process gas supplier or before a substrate is unloaded from each of the process chambers.

11. The method of claim 1, further comprising:
storing, by a memory, comparison data to be compared with a pressure-rising speed value; and
comparing, by a controller, a fluctuation value with the comparison data.

12. The method of claim 11, wherein the comparison data is data when processing of a substrate is operated normally, or data having highest quality.

13. The method of claim 1, wherein the pressure-adjuster is a pressure-adjusting valve,
wherein in (b), the fluctuation in the pressure of the process chamber exhaust pipes is detected in a state where an opening degree of the pressure-adjusting valve is fixed, and
wherein the opening degree of the pressure-adjusting valve is adjusted if there is a divergence in difference between pressure-rising speed values respectively detected by one or more pressure detectors and if there is no divergence in difference between the pressure-rising speed values respectively detected by the one or more pressure detectors and comparison data.

14. The method of claim 1, wherein the pressure-adjuster is a pressure-adjusting valve,
wherein in (b), the fluctuation in the pressure of the process chamber exhaust pipes is detected in a state where an opening degree of the pressure-adjusting valve is fixed, and
wherein maintenance is notified if there is a divergence in difference between pressure-rising speed values respectively detected by one or more pressure detectors or if there is a divergence in difference between any of the pressure-rising speed values and a reference value.

15. The method of claim 1, wherein the pressure-adjuster is a pressure-adjusting valve,
wherein in (b), the fluctuation in the pressure of the process chamber exhaust pipes is detected in a state where an opening degree of the pressure-adjusting valve is fixed, and
wherein processing of a substrate is stopped if there is a divergence in difference between pressure-rising speed values respectively detected by one or more pressure detectors and if there is a divergence in difference between the pressure-rising speed values respectively detected by the one or more pressure detectors and comparison data.

16. The method of claim 1, wherein a diameter of each of the process chamber exhaust pipes is 20 to 30 mm.

17. The method of claim 1, wherein the fluctuation in the pressure of the process chamber exhaust pipes is detected by one or more pressure detectors installed in the gas exhauster.

18. A method of manufacturing semiconductor device, comprising the method of claim 1.

19. A substrate processing apparatus, comprising:
process chambers configured to process substrates;
a process gas supplier configured to supply process gas to the process chambers;
an inert gas supplier configured to supply inert gas to the process chambers;
a gas exhauster comprising process chamber exhaust pipes individually connected to the process chambers, respectively, and a common gas exhaust pipe disposed to merge respective process chamber exhaust pipes on a downstream side of the process chamber exhaust pipes;
a pressure-adjuster provided to the gas exhauster; and
a controller configured to be capable of controlling one or more pressure detectors to detect a fluctuation in pressure of the process chamber exhaust pipes by measuring the pressure of the process chamber exhaust pipes for a predetermined time in parallel with supplying the inert gas to the process chambers.

20. A non-transitory computer-readable recording medium storing a program that causes, by a computer, a substrate processing apparatus to perform a process comprising:
(a) adjusting a pressure of each of process chambers, by adjusting a pressure-adjuster provided to a gas exhauster comprising process chamber exhaust pipes individually connected to the process chambers, respectively, and a common gas exhaust pipe disposed to merge respective process chamber exhaust pipes on a downstream side of the process chamber exhaust pipes, and by exhausting an atmosphere of each of the process chambers from the gas exhauster while supplying inert gas to the process chambers; and
(b) detecting a fluctuation in pressure of the process chamber exhaust pipes by measuring the pressure of the process chamber exhaust pipes for a predetermined time in parallel with supplying the inert gas to the process chambers.

* * * * *